(12) United States Patent
Doshay et al.

(10) Patent No.: US 11,982,824 B2
(45) Date of Patent: May 14, 2024

(54) INTEGRATED CONDUCTIVE APERTURES FOR OPTICAL DEVICES

(71) Applicant: Applied Materials, Inc., Santa Clara, CA (US)

(72) Inventors: Sage Toko Garrett Doshay, Saratoga, CA (US); Naamah Argaman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 17/371,429

(22) Filed: Jul. 9, 2021

(65) Prior Publication Data

US 2022/0018998 A1 Jan. 20, 2022

Related U.S. Application Data

(60) Provisional application No. 63/054,037, filed on Jul. 20, 2020.

(51) Int. Cl.
*G02B 5/00* (2006.01)

(52) U.S. Cl.
CPC ............... *G02B 5/00* (2013.01); *G02B 5/005* (2013.01)

(58) Field of Classification Search
CPC . G02B 5/005; G02B 5/20; G02B 1/00; G02B 13/24; G02B 6/12; G02B 6/42; G02B 5/00; G01R 15/24; G02F 1/1335; H01L 21/027; H04J 14/02
See application file for complete search history.

(56) References Cited

U.S. PATENT DOCUMENTS

| 7,115,525 B2 | 10/2006 | Abatchev et al. |
| 8,189,263 B1 | 5/2012 | Wang et al. |
| 8,715,516 B2 | 5/2014 | Sakamoto et al. |

(Continued)

FOREIGN PATENT DOCUMENTS

| CN | 109196387 A | 1/2019 |
| CN | 109343219 A | 2/2019 |

(Continued)

OTHER PUBLICATIONS

International Search Report and Written Opinion for PCT/US2020/033428 dated Oct. 20, 2020.

(Continued)

*Primary Examiner* — Stephone B Allen
*Assistant Examiner* — Tamara Y. Washington
(74) *Attorney, Agent, or Firm* — Patterson + Sheridan, LLP

(57) ABSTRACT

Embodiments of the present disclosure generally relate to optical devices. Specifically, embodiments of the present disclosure relate to optical devices with one or more optical component circuits. The optical devices including one or more optical component circuits prevent the user from exposure to light when a conductive pathway is interrupted via aperture breakage, for example, from the user dropping the substrate, or from the user dropping the optical device. The conductive pathway allows for current to flow from a power source through the apertures and to one or more light sources and, in some embodiments, one or more light detectors. Aperture breakage resulting in the interruption of the conductive pathway prevents current from being provided to the one or more light sources and/or one or more light detectors to prevent (e.g., automatically prevent) light exposure to the user.

17 Claims, 7 Drawing Sheets

(56) References Cited

U.S. PATENT DOCUMENTS

| | | |
|---|---|---|
| 2002/0044345 A1 | 4/2002 | Takeuchi et al. |
| 2004/0190338 A1 | 9/2004 | Lee |
| 2005/0233487 A1 | 10/2005 | Liu et al. |
| 2012/0314991 A1 | 12/2012 | Kang et al. |
| 2014/0241661 A1 | 8/2014 | Chen et al. |
| 2015/0219806 A1 | 8/2015 | Arbabi et al. |
| 2016/0252727 A1 | 9/2016 | Mack et al. |
| 2018/0172988 A1 | 6/2018 | Ahmed et al. |
| 2018/0188542 A1 | 7/2018 | Waldern et al. |
| 2018/0217186 A1 | 8/2018 | Pfefferlein et al. |
| 2018/0231702 A1 | 8/2018 | Lin et al. |
| 2018/0284428 A1 | 10/2018 | Guenter |
| 2018/0292676 A1 | 10/2018 | Alexander |
| 2018/0306425 A1 | 10/2018 | Massmann et al. |
| 2018/0335629 A1 | 11/2018 | Cheng et al. |
| 2018/0337743 A1 | 11/2018 | Jou et al. |
| 2019/0137762 A1 | 5/2019 | Hu |
| 2019/0137777 A1 | 5/2019 | Yang et al. |
| 2019/0146151 A1 | 5/2019 | Meister et al. |
| 2019/0154877 A1 | 5/2019 | Capasso et al. |
| 2020/0011514 A1 | 1/2020 | Fu |

FOREIGN PATENT DOCUMENTS

| | | |
|---|---|---|
| CN | 109799611 A | 5/2019 |
| JP | 2010504631 A | 2/2010 |
| JP | 2020047874 A | 3/2020 |
| JP | 2018528446 A | 10/2020 |
| KR | 1020110070571 A | 6/2011 |
| KR | 20180113472 A | 10/2018 |
| TW | 200741328 A | 11/2007 |
| WO | 2018142339 A1 | 8/2018 |
| WO | 2018204856 A1 | 11/2018 |

OTHER PUBLICATIONS

Taiwan Office Action issued to Application No. 109118434 dated Mar. 2, 2021.
International Searh Report/ Written Opinion issued to PCT/US2021/040866 dated Oct. 29, 2021.
Japanese Office Action issued to Patent Application No. 2023-503995 dated Jan. 9, 2024.
India Examination Report issued to Application No. 202147061439 dated Apr. 18, 2022.
Japanese Office Action issued to Application No. 2021-571873 dated Feb. 15, 2023.
Chinese Office Action issued to Application No. 202080053854.X dated Jan. 28, 2023.
European Search Report issued to Patent Application No. 20817680.0 dated May 26, 2023.
European Search Report issued to Application No. 20817990.3 dated Jun. 15, 2023.
Japanese Office Action issued to Patent Application No. 2021-571873 dated Jul. 25, 2023.
China Office Action issued to Patent Application No. 202080053854.X dated Aug. 17, 2023.
European Search Report issued to Patent Application No. 20817990.3 dated Sep. 15, 2023.
Supplemental European Search Report issued to Patent Application No. 20817990.3 dated Oct. 4, 2023.
Korean Office Action issued to Patent Application No. 10-2021-7043146 dated Jan. 24, 2024.

INTEGRATED CONDUCTIVE APERTURES FOR OPTICAL DEVICES

CROSS-REFERENCE TO RELATED APPLICATIONS

This application claims the benefit of U.S. Provisional Patent Application No. 63/054,037, filed on Jul. 20, 2020, the contents of which are herein incorporated by reference.

BACKGROUND

Field

Embodiments of the present disclosure generally relate to optical devices. Specifically, embodiments of the present disclosure relate to optical devices with one or more optical component circuits.

Description of the Related Art

Optical devices may be used to manipulate the propagation of light. One example of an optical device is a flat optical device, such as a metasurface. Another example of an optical device is a waveguide combiner, such as an augmented reality waveguide combiner. Optical devices in the visible and near-infrared spectrum may require structures, such as nanostructures, disposed on a substrate surface having macroscale dimensions. However, processing transparent substrates to form optical devices is both complex and challenging as an emerging technology. The complexity and challenges of processing transparent substrates present particular needs for improving safety and system longevity. For example, it may be desirable to promptly prevent at least one optical device and a user from exposure to light if the optical device may be potentially damaged. Accordingly, what is needed in the art are optical devices integrated with optical component circuits that instantly switch off light sources and/or light detectors of the optical component circuits if the optical device may be potentially damaged.

SUMMARY

In one embodiment, an optical device is provided. The optical device includes a plurality of structures disposed over a first surface of a substrate of the optical device. The optical device further includes an electrically conductive aperture surrounding and integrated with the plurality of structures. The electrically conductive aperture is disposed over the first surface or over a second surface opposing the first surface. The electrically conductive aperture includes a first aperture contact point and a second aperture contact point. The first aperture contact point is operable to be connected to at least one of a light source or a light detector. The second aperture contact point is operable to be connected to a power source. The power source is operable to be connected to the light source or the light detector at a power source contact point.

In another embodiment, an optical device is provided. The optical device includes a plurality of structures disposed over a first surface of a substrate of the optical device. The optical device further includes an electrically conductive aperture surrounding and integrated with the plurality of structures. The electrically conductive aperture is disposed over the first surface or over a second surface opposing the first surface. The electrically conductive aperture includes a first aperture contact point and a second aperture contact point. The first aperture contact point is operable to be connected to at least one of a light source or a light detector. The second aperture contact point is operable to be connected to a power source. The power source is operable to be connected to the light source or the light detector at a power source contact point such that power is disconnected from the light source and the light detector when at least a portion of the electrically conductive aperture is broken.

In yet another embodiment, a device is provided. The device includes one or more optical devices. Each optical device includes a plurality of structures disposed over a first surface of a substrate and an electrically conductive aperture. The electrically conductive aperture surrounds the plurality of structures and is disposed over the first surface or over a second surface opposing the first surface. The electrically conductive aperture includes a first aperture contact point and a second aperture contact point. The device further includes at least one of a light source or a detector connected to the first aperture contact point. The device further includes a power source connected to the second aperture and connected to the light sources or the light detectors at a power source contact point.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to optical devices with one or more optical component circuits. The optical devices with the one or more optical component circuits described herein prevent the optical devices and user from exposure to light from light sources and/or light detectors when the conductive pathway of the optical component circuits is interrupted. Embodiments of the optical devices described herein include a plurality of structures disposed over a first surface of a substrate, and an electrically conductive aperture surrounding and integrated with the plurality of structures, the electrically conductive aperture is disposed over the first surface or over a second surface opposing the first surface.

Figure 1A:
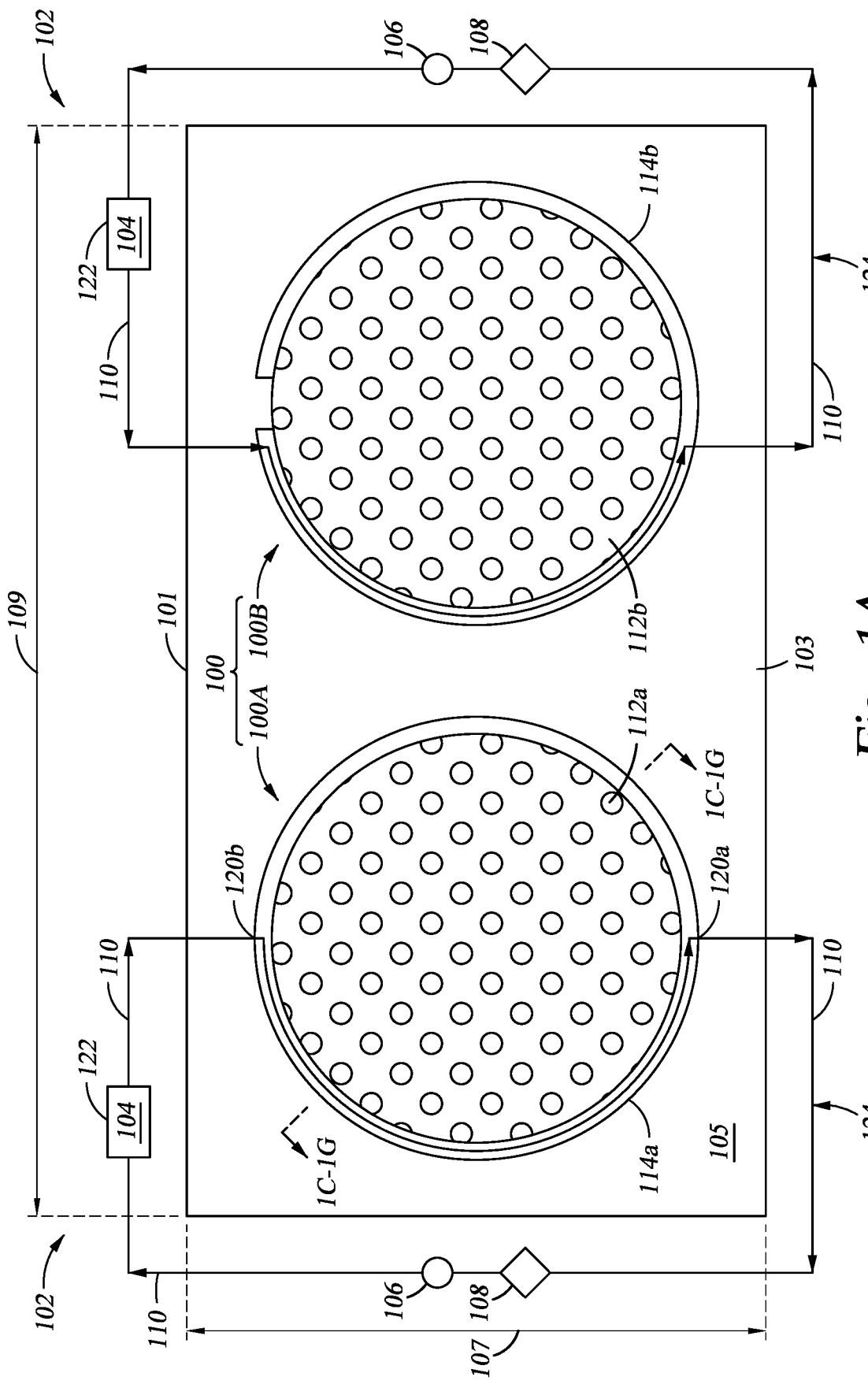
FIGS. 1A and 1B are schematic, top views of a substrate illustrating two optical devices having at least one optical component circuit according to an embodiment.
Figure 1B:
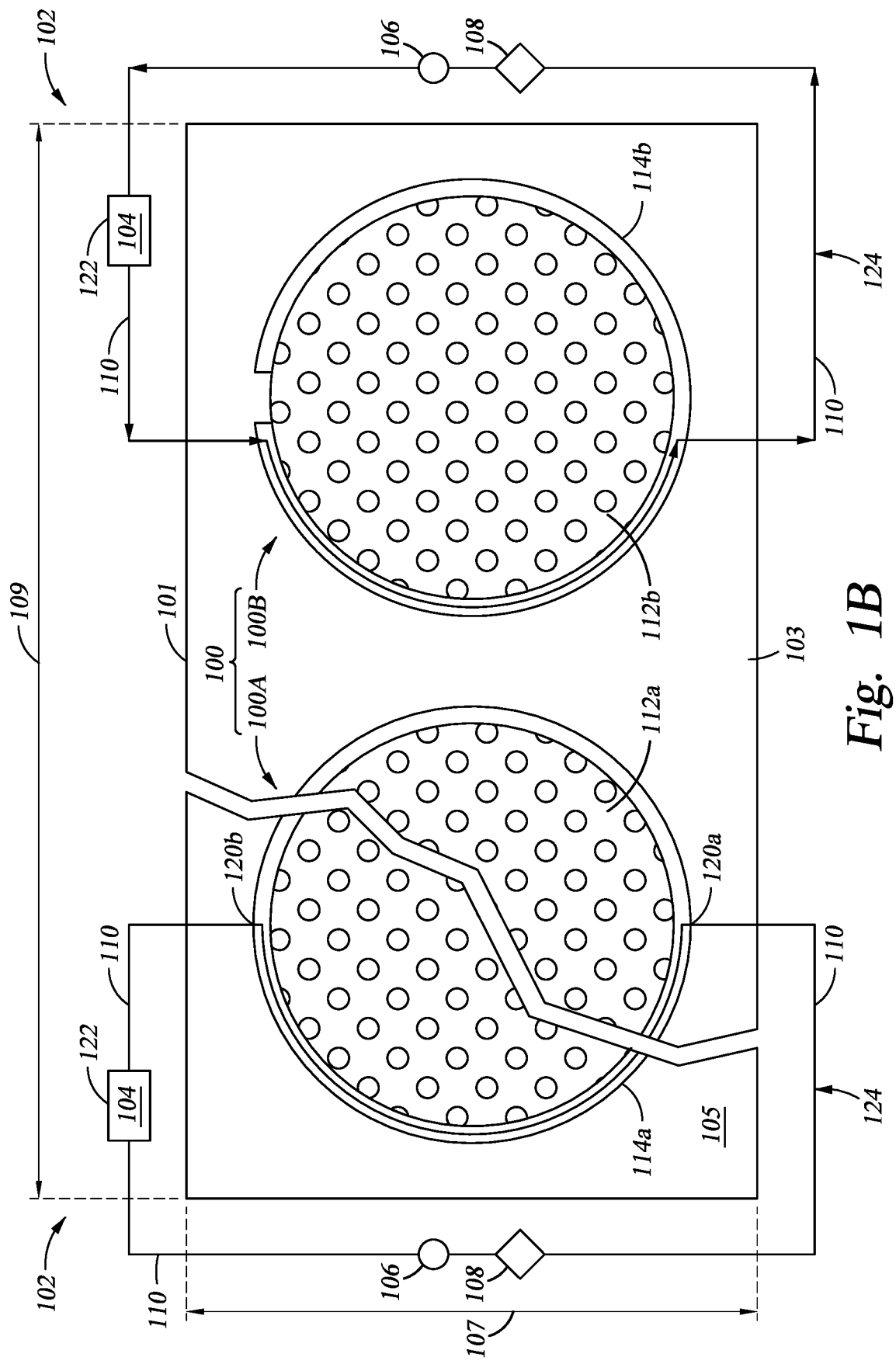

FIGS. 1A and 1B are schematic, top views of a substrate illustrating two optical devices 100 having at least one optical component circuit 102. It is to be understood that while two optical devices 100 are shown, more or fewer optical devices are contemplated. While FIGS. 1A and 1B depict each of the optical devices 100 coupleable to separate optical component circuits 102, each of the optical devices 100 described herein may be coupleable to the same optical component circuit 102. The substrate 101 include a surface 103 having a length 107 and a width 109. In one embodiment, which may be combined with other embodiments described herein, the surface 103 of the substrate 101 may have macroscale dimensions, such as, the length 107 greater than about 2 centimeters (cm) and the width 109 greater than about 2 cm. In one embodiment, which may be combined with other embodiments described herein, the surface 103 of the substrate may have macroscale dimensions, such as, the length 107 greater than about 0.5 millimeters (mm) and the width greater than about 0.5 mm.

The substrate 101 may also be selected to transmit a suitable amount of light of a desired wavelength or wavelength range, such as one or more wavelengths from about 100 nanometers (nm) to about 3000 nm. Without limitation, in some embodiments, the substrate 101 is configured such that the substrate 101 transmits greater than or equal to about 50% to about 100%, of an infrared (IR) to ultraviolet (UV) region of the light spectrum. The substrate 101 may be formed from any suitable material, provided that the substrate 101 can adequately transmit light in a desired wavelength or wavelength range and can serve as an adequate support for the one or more optical devices 100 described herein. In some embodiments, which may be combined with other embodiments described herein, the material of the substrate 101 has a refractive index that is relatively low, as compared to the refractive index of a structure material of the plurality of structures 112a, 112b of the one or more optical devices 100. In other embodiments, which can be combined with other embodiments described herein, the material of substrate 101 has a refractive index that is similar to the refractive index of the structure material of the plurality of structures 112a, 112b of the one or more optical devices 100.

Substrate selection may include substrates of any suitable material, including, but not limited to, amorphous dielectrics, non-amorphous dielectrics, crystalline dielectrics, silicon oxide, polymers, and combinations thereof. In some embodiments, which may be combined with other embodiments described herein, the substrate 101 includes a transparent material. In one embodiment, which may be combined with other embodiments described herein, the substrate 101 is transparent with an absorption coefficient smaller than 0.001. Suitable examples may include an oxide, sulfide, phosphide, telluride or combinations thereof. In one example, the substrate 101 includes silicon (Si), silicon dioxide ($SiO_2$), silicon nitride (SiN), fused silica, quartz, silicon carbide (SiC), germanium (Ge), silicon germanium (SiGe), indium phosphide (InP), gallium arsenide (GaAs), gallium nitride (GaN), sapphire, high-index transparent materials such as high-refractive-index glass, or combinations thereof.

Embodiments described herein provide for one or more optical devices 100, such as the optical devices 100A, 100B shown in FIGS. 1A and 1B. In some embodiments, which may be combined with other embodiments described herein, the optical devices 100A, 100B are flat optical devices, such as metasurfaces. In other embodiments, which may be combined with other embodiments described herein, the optical devices 100A, 100B are waveguide combiners, such as augmented reality waveguide combiners. In one embodiment, which may be combined with other embodiments described herein, the one or more optical devices 100 may be used for diffuser applications. In another embodiment, which may be combined with other embodiments described herein, the one or more optical devices 100 may be used as one or more lenses of a camera, such as a cell phone camera for applications that may include, but are not limited to, user identification or image acquisition. In another embodiment, which may be combined with other embodiments described herein, the one or more optical devices 100 may be used in 3D sensing applications. In another embodiment, which may be combined with other embodiments described herein, the one or more optical devices 100 may be used in time-of-flight sensing applications. In another embodiment, which may be combined with other embodiments described herein, the one or more optical devices 100 may be used as one or more lenses or optical elements of an augmented reality device.

In one embodiment, the optical devices 100A, 100B include a plurality of structures 112a, 112b and an aperture 114a, 114b. The aperture 114a, 114b surrounds, e.g., is disposed adjacent to, the plurality of structures 112a, 112b. In one embodiment, which may be combined with other embodiments described herein, the aperture 114a, 114b (shown in FIGS. 1C-1F) is disposed over the surface 103 of the substrate 101. In another embodiment, which may be combined with other embodiments described herein, the aperture 114a, 114b (shown in FIG. 1G) is disposed on a surface 113 of the substrate 101 opposite to the surface 103. In one embodiment, which may be combined with other embodiments described herein, an auxiliary portion 105 of the surface 103 of the substrate 101 includes one or more auxiliary structures (e.g., dummy structures) disposed on or integral with the auxiliary portion. In another embodiment, which may be combined with other embodiments described herein, the aperture 114a, 114b is a dark-field mask and is disposed over the auxiliary portion 105.

The structures 112a, 112b may be nanostructures having sub-micron dimensions, e.g., nano-sized dimensions, such as critical dimensions 116 (shown in FIGS. 1C-1G) less than 1 micrometer (µm). In one embodiment, which may be combined with other embodiments described herein, the critical dimensions 116 are about 20 nanometers (nm) to about 900 nm. In some embodiments, which may be combined with other embodiments described herein, as shown in FIGS. 1C-1G, at least one of the structures 112a has a critical dimension 116 different than the other critical dimensions 116 of the structures 112a. In other embodiments, each of the structures 112a have the same critical dimension 116. In one embodiment, which may be combined with other embodiments described herein, the structures 112a of the optical device 100A and the structures 112b of the optical devices 100A are the same. In another embodiment, which may be combined with other embodiments described herein, the structures 112a of the optical device 100A and the structures 112b of the optical devices 100A are different. In one embodiment, which may be combined with other embodiments described herein, the structures 112a, 112b are formed of the substrate material. In another embodiment, which may be combined with other embodiments described herein, structures of the structures 112a, 112b include one or more structure materials. While FIGS. 1A and 1B depict the structures 112a, 112b as having circular or oval shaped cross-sections, the cross-sections of the structures 112a, 112b may have other shapes, including, but not limited to, square, rectangular, triangular, and/or irregular shaped cross-sections. While FIGS. 1A and 1B depict the structures 112a, 112b arranged in a rectangular pattern, the structures 112a, 112b may be arranged in other patterns, such as square, circular, oval, triangular, and/or irregular shaped patterns. While FIGS. 1A and 1B depict the apertures 114a, 114b having a circular shape, the apertures 114a, 114b may have other shapes, such as rectangular, square, circular, oval, triangular, and/or irregular shapes. In some embodiments, which may be combined with other embodiments described herein, the apertures 114a, 114b are a different shape than the pattern of the structures 112a, 112b.

In one embodiment, which may be combined with other embodiments described herein, the structure material of the structures 112a, 112b includes non-conductive materials, such as dielectric materials. The dielectric materials may include amorphous dielectrics, non-amorphous dielectrics, and crystalline dielectrics. Examples of the dielectric materials include, but are not limited to, silicon-containing materials, such as, Si, silicon nitride ($Si_3N_4$), silicon oxynitride, and silicon dioxide. The silicon may be crystalline silicon, polycrystalline silicon, and/or amorphous silicon (a-Si). In another embodiment, which may be combined with other embodiments described herein, the structure material of the structures 112a, 112b includes metal-containing dielectric materials. Examples of metal-containing dielectric materials include, but are not limited to, titanium dioxide ($TiO_2$), zinc oxide (ZnO), tin dioxide ($SnO_2$), aluminum-doped zinc oxide (AZO), fluorine-doped tin oxide (FTO), cadmium tin oxide ($Cd_2SnO_4$), zinc tin oxide ($SnZnO_3$), and niobium oxide ($Nb_2O_5$) containing materials.

As described, the aperture 114a, 114b surrounds, e.g., is disposed adjacent to, the plurality of structures 112a, 112b. In one embodiment, which may be combined with other embodiments described herein, the optical devices 100A, 100B may include one or more additional apertures in addition to the aperture 114a, 114b. The aperture 114a, 114b has a width 118. In one embodiment, which may be combined with other embodiments described herein, the width 118 is the same throughout the aperture 114a, 114b. In another embodiment, which may be combined with other embodiments described herein, the width 118 of at least one portion of the aperture 114a, 114b is different. In one embodiment, which may be combined with other embodiments described herein, the width 118 is about 10 μm to about 1000 μm. In one embodiment, which can may be combined with other embodiments described herein, the aperture 114a, 114b forms a closed loop. In another embodiment, which may be combined with other embodiments described herein, the aperture 114a, 114b contains an opening. The aperture 114a, 114b includes one or more aperture materials. The one or more aperture materials include at least one conductive material. In one embodiment, which may be combined with other embodiments described herein, the one or more aperture materials may also include an opaque material such that one or more wavelengths in the range of about 100 to about 3000 nm are not transmitted. The opaque aperture 114a, 114b may prevent stray light (i.e., light of an impinging beam being greater than the surface area the structures 112a, 112b) from degrading the functionality of the optical devices 102a, 102b. In another embodiment, which may be combined with other embodiments described herein, the one or more aperture materials may also include a transparent material such that one or more wavelengths in the range of about 100 to about 3000 nm are transmitted. The one or more aperture materials, i.e., material of the apertures, include, but are not limited to, chromium (Cr), titanium nitride (TiN), a-Si, titanium (Ti), titanium oxide ($TiO_2$), indium tin oxide (ITO), gold (Au), copper (Cu), tungsten (W), and aluminum (Al) containing materials.

Figure 1C:
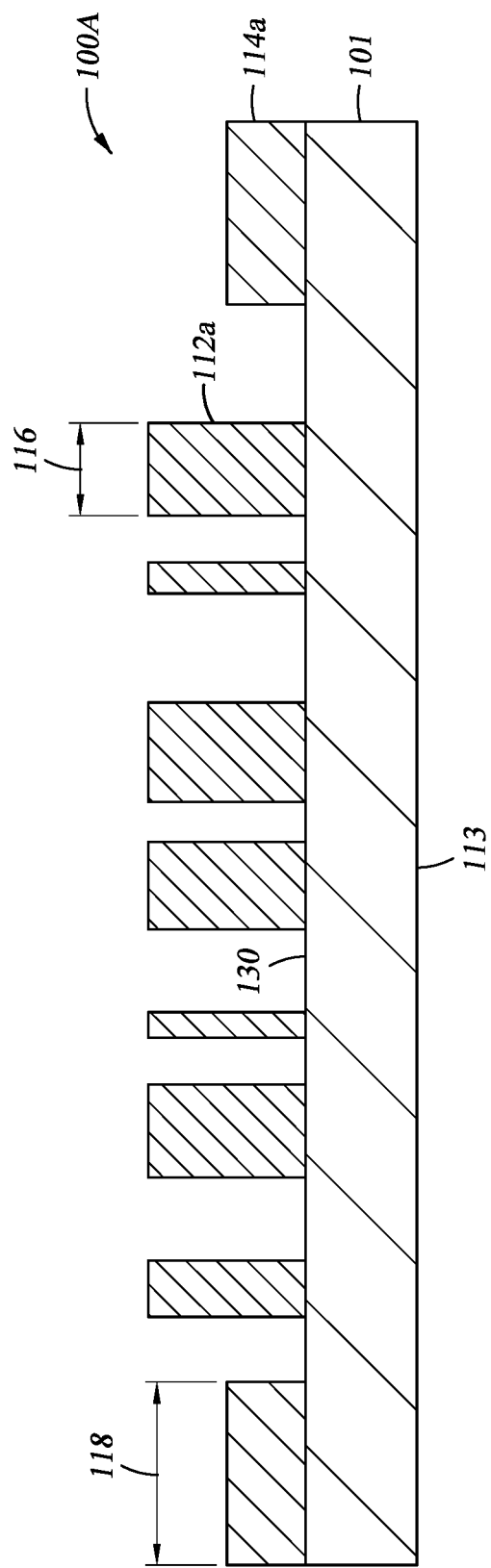
FIGS. 1C-1G are schematic, cross-sectional views of an optical device according to embodiments.
Figure 1D:
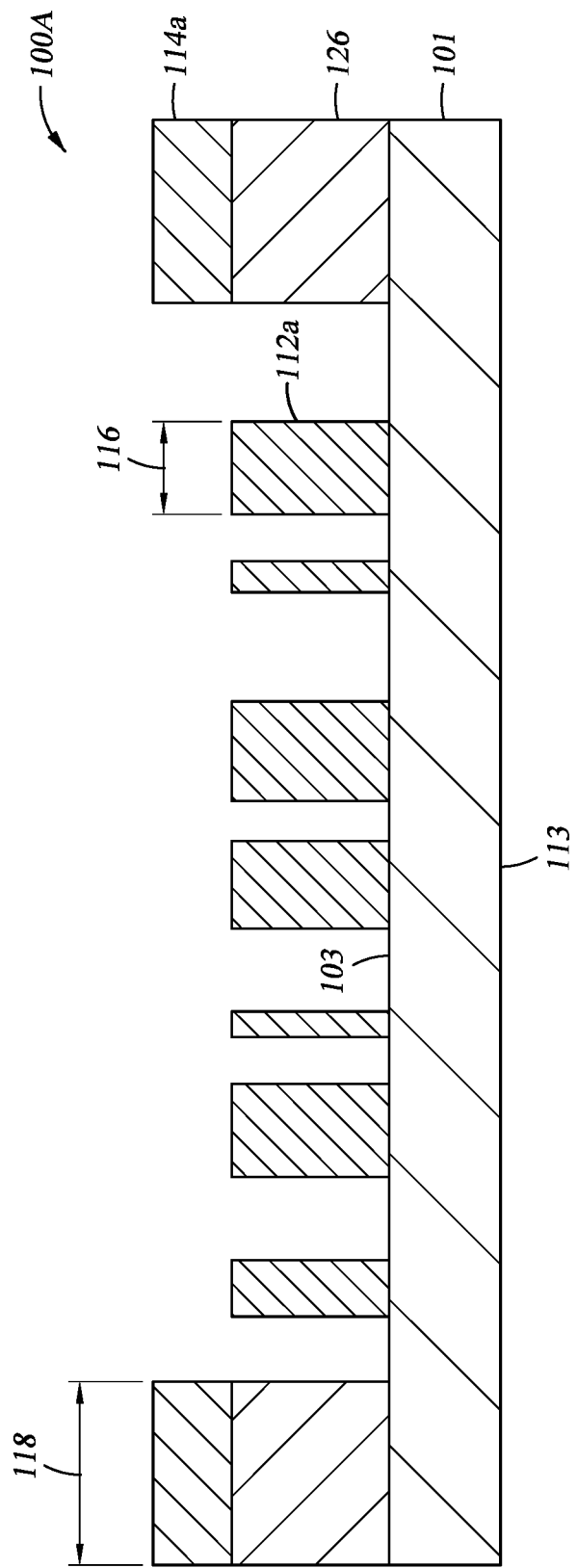
Figure 1E:
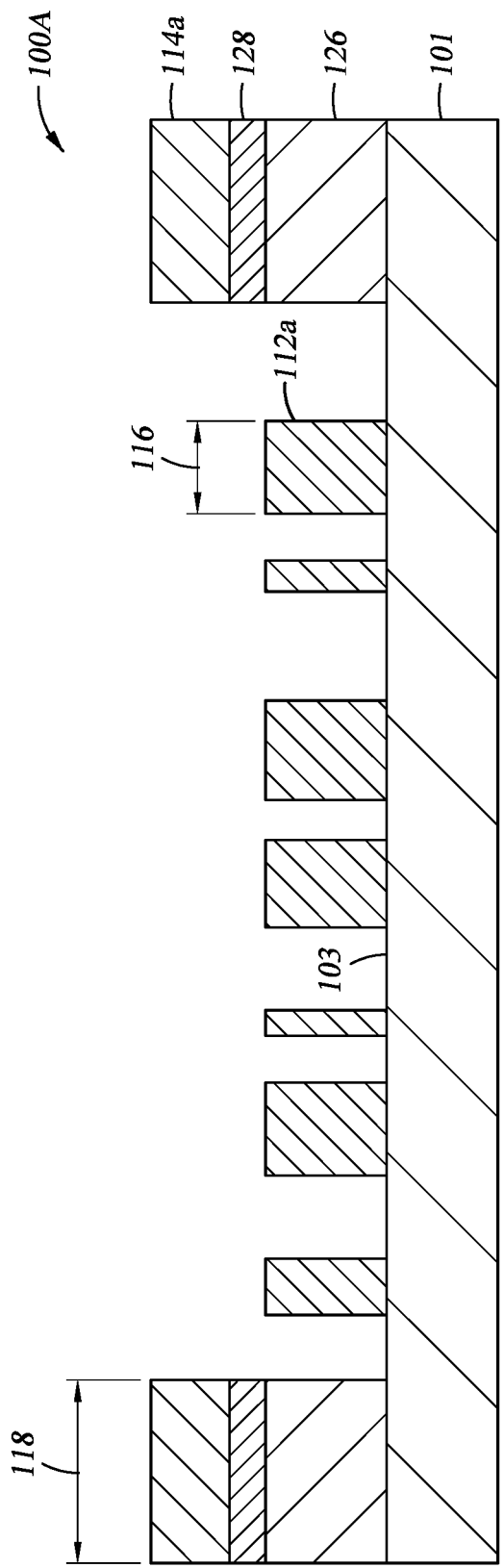
Figure 1F:
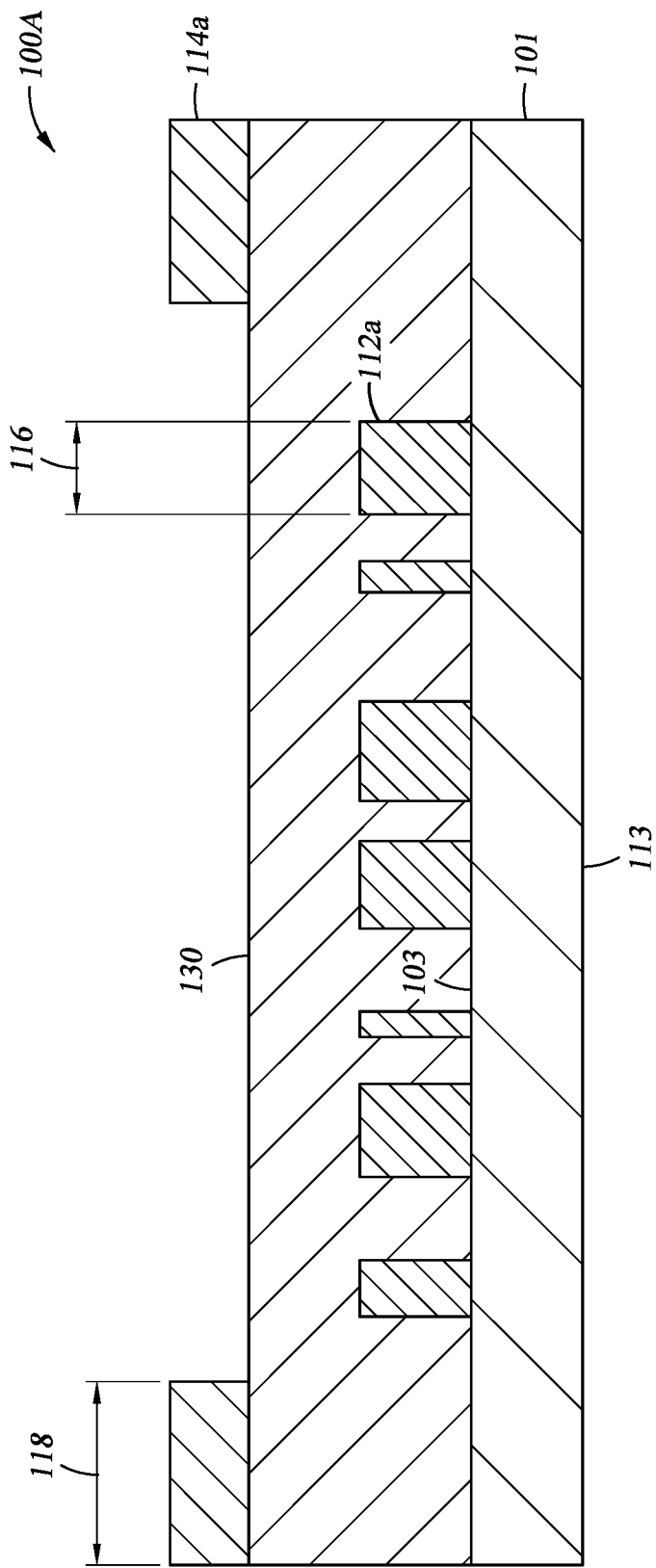
Figure 1G:
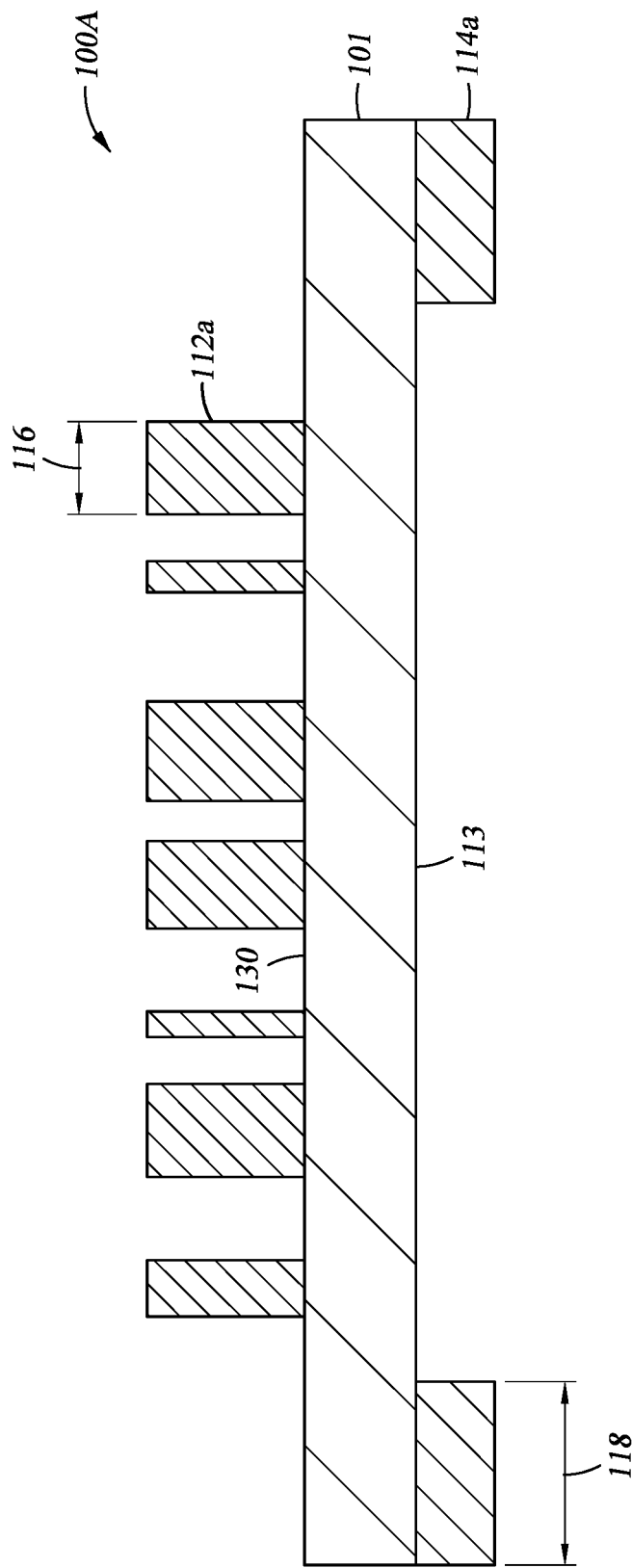

FIGS. 1C-1E are schematic, cross-sectional views of the optical device 100A. As shown in FIG. 1C, in one embodiment, which may be combined with other embodiments described herein, the optical device 100A includes the aperture 114a and the structures 112a disposed on the surface 103 of the substrate 101. As shown in FIG. 1D, in one embodiment, which may be combined with other embodiments described herein, the optical device 100A includes the structures 112a disposed on the surface 103 of the substrate 101, and the aperture 114a is disposed on a peripheral structure 126 of the structures 112a. As shown in FIG. 1E, in one embodiment, which may be combined with other embodiments described herein, the optical device 100A includes the structures 112a disposed on the surface 103 of the substrate 101, and the aperture 114a is disposed on residual portions of a hardmask 128 disposed on the peripheral structure 126 of the structures 112a. The hardmask 128 may be utilized during fabrication of the optical device 100A, and residual portions of the hardmask 128 may remain under the aperture 114a. In one embodiment, which may be combined with other embodiments described herein, residual portions of the hardmask 128 may be used as an aperture. As shown in FIG. 1F, in one embodiment, which may be combined with other embodiments described herein, the optical device 100A includes the structures 112a disposed on the surface 103 of the substrate 101, and the aperture 114a is disposed on an encapsulation layer 130 disposed over the structures 112a. As shown in FIG. 1G, in one embodiment, which may be combined with other embodiments described herein, the structures 112a are disposed on the surface 103, and the aperture 114a is disposed on the surface 113 of the substrate 101 opposite to the surface 103 of the substrate 101.

The optical component circuit 102 includes one of one or more light sources 106. In another embodiment, which may be combined with other embodiments described herein, the optical component circuit 102 also includes one or more light detectors 108. The one of one or more light sources 106 and/or one or more light detectors 108 may be positioned in a propagation direction of the one or more optical devices 100. The one or more light sources 106 include, but are not limited to, a display (e.g., a microdisplay) and/or a light emitting device. The display includes, but is not limited to, a liquid crystal display (LCD) or any other display operable with the one or more optical devices 100. The light emitting device includes, but is not limited to, a light-emitting diode (LED), a laser, a vertical-cavity surface-emitting laser (VCSEL), a non-VCSEL laser, or any emitter of light. The one or more light detectors 108 include, but are not limited to, a complementary metal-oxide-semiconductor (CMOS) detector or any other light detector operable with the one or more optical devices 100.

The one or more light sources 106 and, in some embodiments, the one or more light detectors 108 of the optical component circuit 102 are electrically connected to the aperture 114a, 114b at a first aperture contact point 120a and are electrically connected to a power source 104 at a power source contact point 122. The one or more light sources 106 and, in some embodiments, the one or more light detectors 108 are electrically connected via one or more wires 110. The power source 104 includes, but is not limited to, a battery, actuator, or any other power source that is operable to provide power to the one or more light sources 106 and, in some embodiments, the one or more light detectors 108. The power source 104 is electrically connected via the wires 110. The power source 104 is electrically connected to the aperture 114a, 114b at a second aperture contact point 120b to complete the optical component circuit 102. The optical component circuit 102 provides for a conductive pathway 124 for current to flow from the power source 104 through the aperture 114a, 114b and to the one or more light sources 106 and, in some embodiments, the one or more light detectors 108.

As shown in FIG. 1A, the optical component circuit 102 of the optical device 100A provides for the conductive pathway 124 when the aperture 114a is not broken. The one or more light sources 106 and, in some embodiments, the one or more light detectors 108 are not powered when a portion of the aperture 114a is broken. In some embodiments, which may be combined with other embodiments described herein, with each of the optical devices 100A, 100B coupleable to the same optical component circuit 102, if one of the aperture 114a and aperture 114b is broken, current does not flow to the one or more light sources 106 and/or one or more light detectors 108 of the optical devices 100A, 100B. In some embodiments, which may be combined with other embodiments described herein, with each of the optical devices 100A, 100B coupleable to the separate optical component circuits 102, as shown in FIG. 1B, if the aperture 114a is broken, current does not flow to the one or more light sources 106 and/or the one or more light detectors 108 of the optical device 100A while current does flow to the one or more light sources 106 and/or one or more light detectors 108 of the optical device 100B.

In summation, optical devices 100 with the one or more optical component circuits 102 are provided. The optical devices 100 with the one or more optical component circuits 102 described herein prevent the user from exposure to light when the conductive pathway 124 is interrupted via aperture breakage, for example, from the user dropping the substrate 101, or from the user dropping the optical device 100A, 100B. Aperture breakage resulting in the interruption of the conductive pathway 124 prevents current from being provided to the one or more light sources 106 and/or one or more light detectors 108 to prevent (e.g., automatically prevent) light exposure to the user.

While the foregoing is directed to embodiments of the present disclosure, other and further embodiments of the disclosure may be devised without departing from the basic scope thereof, and the scope thereof is determined by the claims that follow.

The invention claimed is:

1. An optical device, comprising:
a plurality of structures disposed over a first surface of a substrate of the optical device;
an electrically conductive aperture surrounding and integrated with the plurality of structures, the electrically conductive aperture disposed over the first surface or over a second surface opposing the first surface, the electrically conductive aperture having a first aperture contact point and a second aperture contact point, wherein:
the first aperture contact point is operable to be connected to at least one of:
a light source; or
a light detector; and
the second aperture contact point is operable to be connected to a power source, the power source operable to be connected to the light source or the light detector at a power source contact point; and
a conductive pathway for a current to flow from the power source through the electrically conductive aperture wherein the conductive pathway is operable to be interrupted to prevent the flow to the current from the power source to the light source or the light detector.

2. The optical device of claim 1, wherein the electrically conductive aperture is disposed on a peripheral structure of the plurality of structures.

3. The optical device of claim 2, wherein the electrically conductive aperture is disposed on residual portions of a hardmask disposed on the peripheral structure of the plurality of structures.

4. The optical device of claim 1, wherein an encapsulation layer is disposed over the plurality of structures and the first surface of the substrate and the electrically conductive aperture is disposed on the encapsulation layer.

5. The optical device of claim 1, wherein aperture materials of the electrically conductive aperture include chromium (Cr), titanium nitride (TiN), a-Si, titanium (Ti), titanium oxide (TiO$_2$), indium tin oxide (ITO), gold (Au), copper (Cu), tungsten (W), aluminum (Al) containing materials, or combinations thereof.

6. An optical device, comprising:
a plurality of structures disposed over a first surface of a substrate of the optical device;
an electrically conductive aperture surrounding and integrated with the plurality of structures, the electrically conductive aperture disposed over the first surface or over a second surface opposing the first surface, the electrically conductive aperture having a first aperture contact point and a second aperture contact point, wherein:
the first aperture contact point is operable to be connected to at least one of:
a light source; or
a light detector; and
the second aperture contact point is operable to be connected to a power source, the power source operable to be connected to the light sources or the light detectors at a power source contact point such that power is disconnected from the light source and the light detector when at least a portion of the electrically conductive aperture is broken; and
a conductive pathway for a current to flow from the power source through the electrically conductive aperture wherein the conductive pathway is operable to be interrupted to prevent the flow to the current from the power source to the light source or the light detector.

7. The optical device of claim 6, wherein the electrically conductive aperture is disposed on a peripheral structure of the plurality of structures.

8. The optical device of claim 7, wherein the electrically conductive aperture is disposed on residual portions of a hardmask disposed on the peripheral structure of the plurality of structures.

9. The optical device of claim 7, wherein an encapsulation layer is disposed over the plurality of structures and the first surface of the substrate and the electrically conductive aperture is disposed on the encapsulation layer.

10. The optical device of claim 7, wherein the electrically conductive aperture has a circular, rectangular, square, circular, oval, triangular, or irregular shape.

11. The optical device of claim 7, wherein aperture materials of the electrically conductive aperture include chromium (Cr), titanium nitride (TiN), a-Si, titanium (Ti), titanium oxide (TiO$_2$), indium tin oxide (ITO), gold (Au), copper (Cu), tungsten (W), aluminum (Al) containing materials, or combinations thereof.

12. The optical device of claim 7, wherein structure materials of the plurality of structures include titanium dioxide (TiO$_2$), zinc oxide (ZnO), tin dioxide (SnO$_2$), aluminum-doped zinc oxide (AZO), fluorine-doped tin oxide (FTO), cadmium stannate ($Cd_2SnO_4$), cadmium stannate (tin oxide) (CTO), zinc stannate ($SnZnO_3$), niobium oxide ($Nb_2O_5$), Si, silicon nitride ($Si_3N_4$), silicon oxynitride, silicon dioxide containing materials, or combinations thereof.

13. A device, comprising:
  one or more optical devices, each optical device comprising:
    a plurality of structures disposed over a first surface of a substrate; and
    an electrically conductive aperture surrounding the plurality of structures, the electrically conductive aperture disposed over the first surface or over a second surface opposing the first surface, the electrically conductive aperture including a first aperture contact point and a second aperture contact point;
  at least one of a light source or a detector connected to the first aperture contact point; and
  a power source, the power source connected to the second aperture contact point and connected to the light source or the detector at a power source contact point; and
  a conductive pathway for a current to flow from the power source through the electrically conductive aperture wherein the conductive pathway is operable to be interrupted to prevent the flow to the current from the power source to the light source or the detector.

14. The device of claim 13, wherein each optical device further comprises a conductive pathway for current to flow from the power source through the electrically conductive aperture and to the light source or the detector.

15. The device of claim 13, wherein the plurality of structures may be nanostructures having sub-micron dimensions less than 1 micrometer (μm).

16. The device of claim 13, wherein a width of the electrically conductive aperture is between 10 μm and 1000 μm.

17. The device of claim 13, wherein the one or more light sources include a display or a light emitting device.

* * * * *